US010714829B2

(12) United States Patent
Raney et al.

(10) Patent No.: US 10,714,829 B2
(45) Date of Patent: Jul. 14, 2020

(54) PLANAR PHASED ARRAY ANTENNA

(71) Applicant: Ball Aerospace & Technologies Corp., Boulder, CO (US)

(72) Inventors: Gary A. Raney, Broomfield, CO (US); Peter J. Moosbrugger, Lafayette, CO (US); Bryce W. Unruh, Erie, CO (US)

(73) Assignee: Ball Aerospace & Technologies Corp., Boulder, CO (US)

( * ) Notice: Subject to any disclaimer, the term of this patent is extended or adjusted under 35 U.S.C. 154(b) by 29 days.

(21) Appl. No.: 15/975,331

(22) Filed: May 9, 2018

(65) Prior Publication Data
US 2019/0131706 A1 May 2, 2019

Related U.S. Application Data

(60) Provisional application No. 62/518,457, filed on Jun. 12, 2017, provisional application No. 62/503,740, filed on May 9, 2017.

(51) Int. Cl.
*H01Q 3/34* (2006.01)
*H01Q 21/06* (2006.01)
(Continued)

(52) U.S. Cl.
CPC ............. *H01Q 3/34* (2013.01); *H01L 23/367* (2013.01); *H01Q 1/02* (2013.01);
(Continued)

(58) Field of Classification Search
CPC ............. H01Q 3/34; H01Q 1/02; H01Q 21/00; H01Q 21/06; H01Q 9/04; H05K 1/02; H05K 1/11; H05K 7/204
(Continued)

(56) References Cited

U.S. PATENT DOCUMENTS 8,447,385 B2    5/2013  Sterzer et al.
9,001,879 B2    4/2015  Maltsev et al.
(Continued)

FOREIGN PATENT DOCUMENTS

EP    2178119        4/2010
EP    2178119 A1 *  4/2010  ............. H01L 23/66
(Continued)

OTHER PUBLICATIONS

Ershadi et al. "Wideband Subarray Design for 5G Antenna Arrays," IEEE, 2016 URSI Asia-Pacific Radio Science Conference, Aug. 21-25, 2016, Seoul, Korea, pp. 185-187.
(Continued)

*Primary Examiner* — Andrea Lindgren Baltzell
(74) *Attorney, Agent, or Firm* — Sheridan Ross P.C.

(57) ABSTRACT

Phased array antenna systems are disclosed. An antenna system as disclosed herein can include a plurality of antenna or radiating elements formed on a common plane comprising a first surface of a circuit board. Each antenna element has one or more feeds. Integrated circuits are placed on a second surface of the circuit board. Each integrated circuit is associated with one or more of the antenna elements. Signal lines connecting an integrated circuit to a feed of an antenna element can be shielded using interlayer ground planes and interlayer conductive plugs. In addition, back surfaces of the integrated circuits can be connected to a common heatsink using a thermally conductive medium.

15 Claims, 7 Drawing Sheets

(51) Int. Cl.
H01L 23/367 (2006.01)
H01Q 1/02 (2006.01)
H01Q 21/00 (2006.01)
H05K 1/02 (2006.01)
H05K 1/11 (2006.01)
H05K 1/18 (2006.01)
H05K 7/20 (2006.01)
H01Q 9/04 (2006.01)
H01L 23/42 (2006.01)

(52) U.S. Cl.
CPC ....... *H01Q 21/0075* (2013.01); *H01Q 21/065* (2013.01); *H05K 1/0203* (2013.01); *H05K 1/0243* (2013.01); *H05K 1/111* (2013.01); *H05K 1/181* (2013.01); *H05K 7/2029* (2013.01); *H05K 7/20409* (2013.01); *H05K 7/20436* (2013.01); *H01L 23/42* (2013.01); *H01Q 9/0435* (2013.01); *H05K 2201/10098* (2013.01); *H05K 2201/10545* (2013.01)

(58) Field of Classification Search
USPC .......................................................... 343/893
See application file for complete search history.

(56) References Cited

U.S. PATENT DOCUMENTS

| | | |
|---|---|---|
| 9,001,917 B2 | 4/2015 | Tzanidis et al. |
| 9,343,817 B2 | 5/2016 | Pan |
| 9,531,450 B2 | 12/2016 | Maltsev et al. |
| 9,584,231 B2 | 2/2017 | Xu et al. |
| 9,660,345 B1 | 5/2017 | Gu et al. |
| 2008/0122071 A1 | 5/2008 | Tseng et al. |
| 2011/0308781 A1* | 12/2011 | O'Riordan ......... H01L 23/3737 165/185 |
| 2014/0071018 A1 | 3/2014 | Pan |
| 2014/0072078 A1 | 3/2014 | Sergeyev et al. |
| 2014/0145879 A1 | 5/2014 | Pan |
| 2014/0240186 A1 | 8/2014 | Zhou et al. |
| 2014/0266897 A1 | 9/2014 | Jakoby et al. |
| 2015/0035714 A1 | 2/2015 | Zhou |
| 2015/0200452 A1 | 7/2015 | Oh et al. |
| 2015/0222333 A1 | 8/2015 | Maltsev et al. |
| 2015/0303587 A1 | 10/2015 | Pan |
| 2016/0049723 A1 | 2/2016 | Baks et al. |
| 2016/0127003 A1 | 5/2016 | Xu et al. |
| 2016/0149315 A1 | 5/2016 | Elsherbini et al. |
| 2016/0204507 A1 | 7/2016 | Karjalainen |
| 2016/0218429 A1 | 7/2016 | Klemes |
| 2016/0241348 A1 | 8/2016 | Zirwas et al. |
| 2016/0330643 A1 | 11/2016 | Sahin et al. |
| 2016/0365900 A1 | 12/2016 | Kim et al. |
| 2017/0033462 A1 | 2/2017 | Clemente et al. |
| 2017/0085006 A1 | 3/2017 | Corman et al. |
| 2017/0126304 A1 | 5/2017 | Black et al. |
| 2017/0127295 A1 | 5/2017 | Black et al. |
| 2017/0141465 A1 | 5/2017 | Sharawi |
| 2017/0149143 A1 | 5/2017 | Zirwas et al. |

FOREIGN PATENT DOCUMENTS

| | | |
|---|---|---|
| WO | WO 2017/078851 | 5/2017 |
| WO | WO 2017/086855 | 5/2017 |

OTHER PUBLICATIONS

Ojaroudiparchin et al. "Multi-Layer 5G Mobile Phone Antenna for Multi-User MIMO Communications," IEEE, 23rd Telecommunications forum TELFOR 2015, Serbia, Belgrade, Nov. 24-26, 2015, pp. 559-562.

Ojaroudiparchin et al. "A 28 GHz FR-4 Compatible Phased Array Antenna for 5G Mobile Phone Applications," IEEE, 2015 International Symposium on Antennas and Propagation (ISAP), 2015, 4 pages.

Rebeiz et al. "Millimeter-Wave Large-Scale Phased-Arrays for 5G Systems," 2015 IEEE MTT-S International Microwave Symposium, May 2015, 3 pages.

International Search Report and Written Opinion for International (PCT) Patent Application No. PCT/US18/31872, dated Aug. 1, 2018 9 pages.

\* cited by examiner

PLANAR PHASED ARRAY ANTENNA

CROSS-REFERENCE TO RELATED APPLICATIONS

This application claims the benefit of U.S. Provisional Patent Application Ser. No. 62/503,740, filed May 9, 2017, and of U.S. Provisional Patent Application Ser. No. 62/518,457, filed Jun. 12, 2017, the entire disclosures of which are hereby incorporated herein by reference.

FIELD

The present disclosure is directed to electronically steerable phased array antennas.

BACKGROUND

Radio frequency (RF) communication links are increasingly being used to transfer information, and to control devices. As the number of device that rely on RF communications increases, and as the amount of data transferred by such devices also increases, the RF spectrum available for such communications has become increasingly crowded. This crowding of the radio frequency (RF) spectrum requires that RF devices make efficient use of the available bandwidth.

In order to maximize the available RF communications systems, various techniques and standards have been developed or proposed. For example, narrowly steered beams can be used for point to point communications between pairs of devices, reducing the potential for interference with other devices. In addition, agile systems, such as cognitive radios and software defined radios can detect which communication channels are occupied, and which are available for communications, thereby avoiding interference with other transmissions. Some or all of these systems can make use of multiple element antenna systems, such as planar phased array antennas, which can enable beam steering and multiple-input multiple-output (MIMO) antennas. Systems that can or do utilize such antenna systems include those adhering to the IEEE 802.11n and 802.11as, WiMAX (4G), Long Term Evolution (LTE 4G), and the proposed $5^{th}$ Generation Wireless systems (5G) standards.

As the telecommunications industry rapidly migrates to the new 5G standard, we can expect unprecedented data speeds, low latency and high reliability communications. To support these advancements, millimeter wave frequency bands are being made available on a global scale for 5G base stations, backhauls, fronthauls and customer premises equipment. The wide contiguous bandwidths available at these newly assigned frequencies enable high data rates. Additionally, the associated short wavelengths allow physically compact electronic steerable (active) antennas to be deployed that offer spatial diversity, spectrum reuse, and high antenna directivity (gain) to overcome the higher path loss encountered at millimeter wave frequencies.

However, current wireless communications technology features omni-directional sectored antennas tailored for use at frequencies below 6 GHz. Additionally, only fixed beam horn antennas and slowly steerable reflectors or lenses have been available for commercial development. These technologies are not electronically steerable and require moving parts or multiple antennas to cover a large geographical area. Accordingly, it would be desirable to provide an antenna system that incorporated planar antenna phased technology in order to enhance the spectral efficiency of RF communications networks.

SUMMARY

Embodiments of the present disclosure are directed to antenna systems, phased array antenna systems, and methods for providing antenna systems and phased array antenna systems. A phased array antenna system in accordance with embodiments of the present disclosure can include a plurality of radiating elements and a plurality of processors, with sub-groups including multiple radiating elements from the plurality of radiating elements associated with a single processor. In accordance with still further embodiments of the present disclosure, conductive structures are provided between adjacent ground planes within an antenna device to contain undesired propagation of electromagnetic radiation. Alternatively or in addition, the antenna system can include heat control structures, such as a heat sink thermally connected to the processors by a compliant heat transfer material.

More particularly, at least some embodiments of the present disclosure provide an antenna with radiating elements arrayed on a first planar substrate, and with sub-groups of radiating elements arranged around a shared processor. Each radiating element in a sub-group can be connected to that sub-group's processor by one or more equal length conductors. In accordance with still other embodiments of the present disclosure, the radiating elements can be arranged on a first side of a circuit board, and the processors can be arranged on a second side of the circuit board.

In accordance with further embodiments of the present disclosure, a circuit board having multiple conductive post elements between adjacent ground planes, forming electrical isolation structures, is provided. The post elements can be arranged at intervals around structures used to carry high frequency signals. For example, the post elements can be arranged around conductive vias extending between different layers of the circuit board, or around feed lines extending along layers of the circuit board.

In accordance with still further embodiments of the present disclosure, a heat sink structure is associated with multiple processors. The heat sink structure can include a monolithic or integral structure that is thermally connected to the processors by a compliant heat transfer material. The compliant heat sink material may be in the forms of a compliant paste when sandwiched between the processors and the heat sink. Alternatively, the heat transfer material is a liquid contained in a chamber that is bounded by a heat sink on at least one surface of the chamber. Where the heat transfer material is a liquid, the liquid may be contained in a chamber that allows for a head space or volume, to accommodate expansion of the heat transfer liquid with increasing temperature.

Additional features and advantages of embodiments of the disclosed systems and methods will become more readily apparent from the following description, particularly when taken together with the accompanying drawings.

DETAILED DESCRIPTION

Figure 1A:
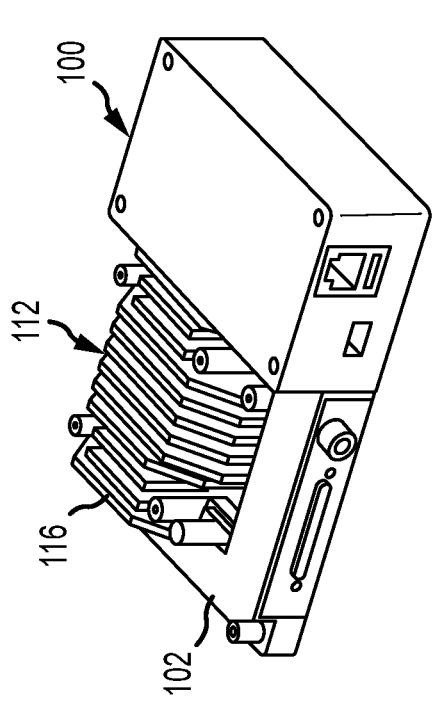
FIGS. 1A-1E are front perspective, rear perspective, back, top, and front views respectively of an example antenna system in accordance with embodiments of the present disclosure.
Figure 1C:
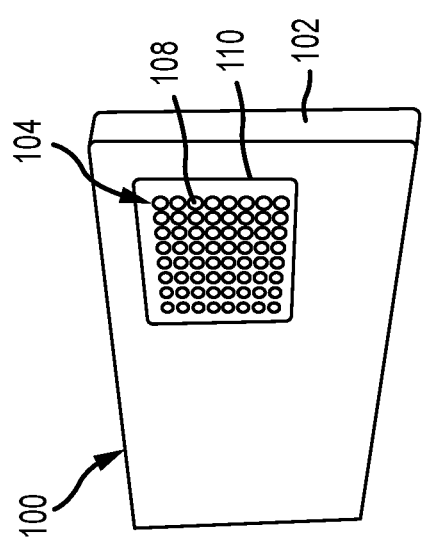
Figure 1B:
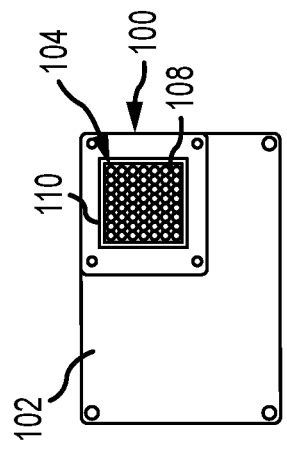
Figure 1D:
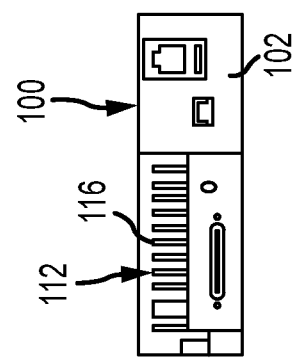
Figure 1E:
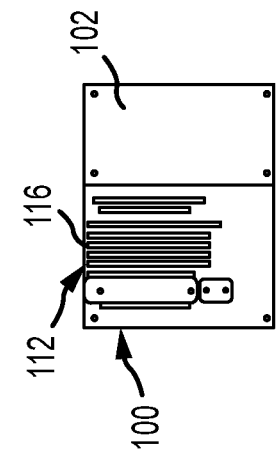

A phased array antenna that provides an electronically steerable active phased array antenna beam for use with communications system, such as 5G wireless telephony or satellite communication technologies, is provided. FIGS. 1A-1E show an example antenna system 100 configuration in accordance with embodiments of the present disclosure in front perspective, rear perspective, back, top, and front views respectively. As shown in FIGS. 1A and 1E, the antenna system 100 can comprise a package or enclosure 102 containing a planar phased array antenna 104 having a plurality of antenna elements 108 disposed in an array. In accordance with further embodiments, the antenna system 100 can comprise a single or a dual polarization phased array antenna 104. The antenna elements 108 can be located on a first side of a circuit board, and some or all of the electronic packages can be mounted on a second side of the circuit board. Feed lines, such as may be included in beamforming combiners, power planes, and control signal lines, can be formed on inner layers of the circuit board.

The antenna 104 can be positioned such that the antenna elements 108 are disposed in or adjacent an aperture 110 in the front side of the antenna package 102. In addition, as shown in FIGS. 1A, 1B, and 1D, the antenna system 100 can includes a heat sink 112 that includes a plurality of heat transfer fins 116 that extend from the back side of the antenna package 102, opposite the array of radiating elements 108.

Figure 2A:
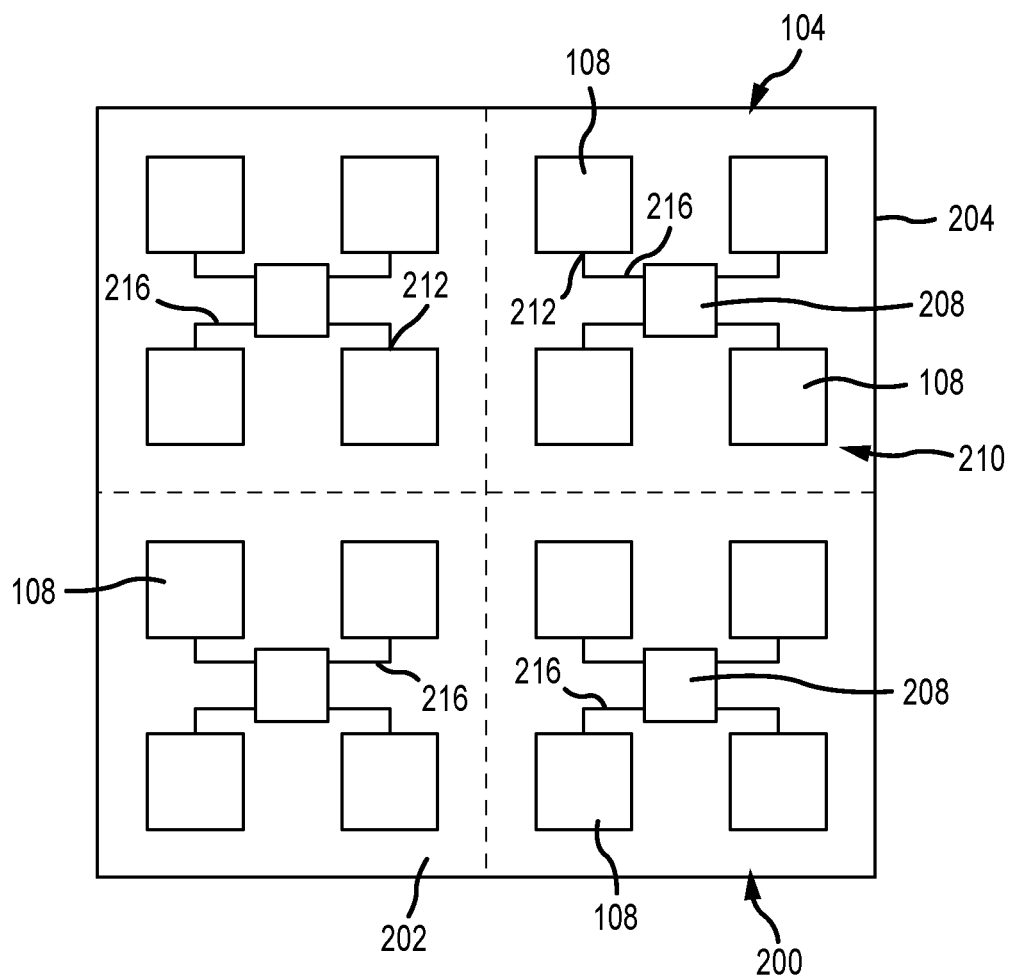
FIGS. 2A-2B depict example antenna array configurations of an antenna system in accordance with embodiments of the present disclosure in a plan view.
Figure 2B:
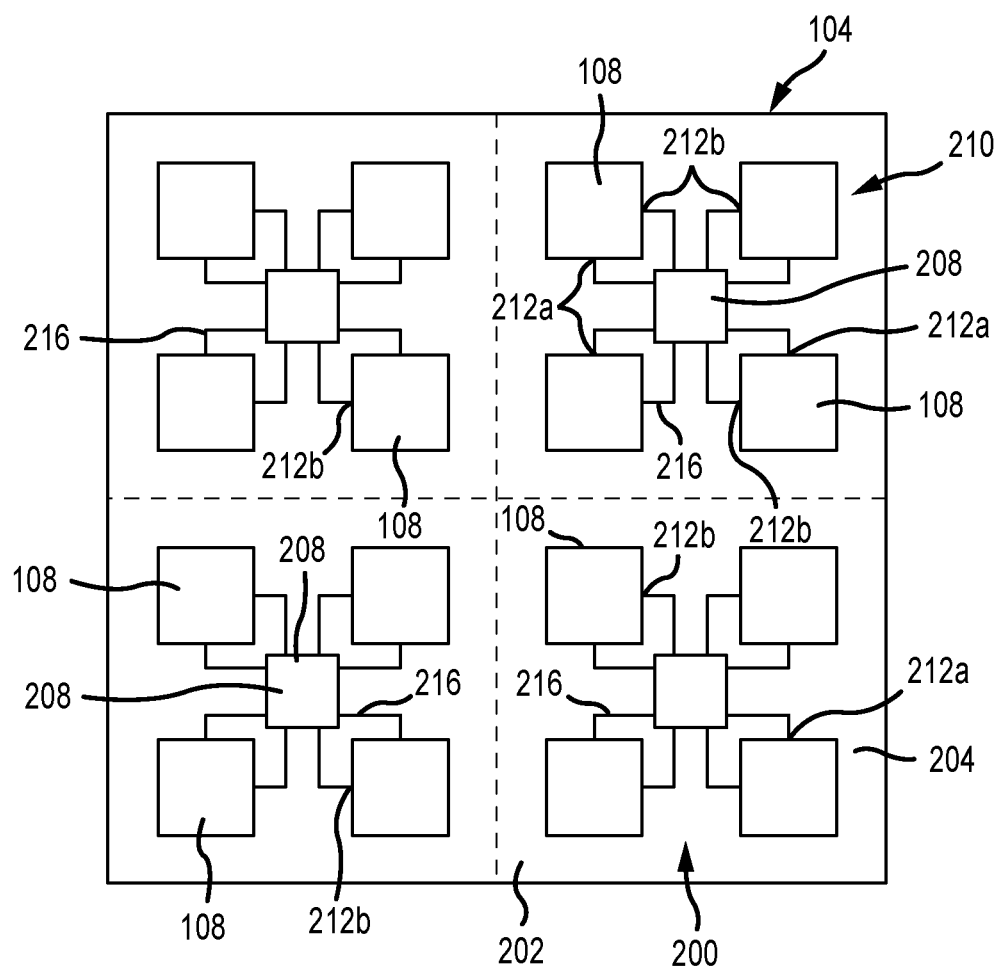

FIGS. 2A-2B illustrate additional features of the antenna system 100, and in particular are plan views of example arrays 200 of antenna elements 108 in accordance with embodiments of the present disclosure. In accordance with embodiments of the present disclosure, the antenna elements 108 are disposed on a first surface 202 of a circuit board 204, such as but not limited to a printed circuit board (PCB), while electronic packages or integrated circuits 208 used to control the array are disposed on a second surface 302 (see FIG. 3) of the printed circuit board 204, opposite the first surface 202. In FIGS. 2A-2B, the circuit board 204 is depicted as being transparent, in order to illustrate the placement of the antenna elements 108 relative to the electronic packages 208. As examples, the electronic packages 208 are integrated circuits or chips that perform phase shifting, amplifying, delay, and other functions with respect to signals provided to or received from associated antenna elements 108.

FIGS. 2A-2B also show the grouping of elements 108 and electronic packages 208 according to an example. Here, each electronic package 208 is associated with a sub-group 210 of antenna elements 108. In this example, four antenna elements 108 are included in each sub group 210. However, any number of antenna elements 108 can be associated with an electronic package 208. In addition, FIGS. 2A-2B show a total of 16 elements 108, divided into four sub-groups 210. However, any number of elements 108 and sub-groups 210 can be included in the antenna 100.

The feed points 212 of the antenna elements 108 are oriented so that the length of each of the feed lines 216 is minimized. FIG. 2A differs from FIG. 2B in that FIG. 2A depicts antenna elements 108 that each have a single feed point 212, while FIG. 2B depicts an arrangement in which the antenna elements 108 each have first 212a and second 212b feed points. The first 212a and second 212b feed points can be used in connection with different wavelengths, polarizations, received signals, or transmitted signals, or the same signals. In particular, the single feed point 212 of each antenna element 108 of the embodiment of FIG. 2A and the first feed point 212a of the antenna elements 108 of the embodiment depicted in FIG. 2B are all oriented in the same direction (vertical in the figures), and are oriented towards the associated electronic package 208. For the embodiment featuring antenna elements 108 having two feed points 212a and 212b, the second feed points 212b are all oriented in the same direction (horizontal in FIG. 2B). Moreover, the second feed points 212b are oriented such that they are perpendicular to the first feed points 212a. This feed point 212 configuration ensures that the length of the feed lines 216 extending between the elements 108 and the integrated circuits 208 are minimized. Moreover, the feed points 212 and feed lines 216 can be configured so that the feed lines 216 are all of the same length. Although the antenna elements 108, the electronics packages 208, the feed points 212, and the feed lines 216 are all illustrated in FIGS. 2A-2B in order to show their relative locations in plan view, it should be appreciated that the antenna elements 108 and the integrated circuits 208 are on opposite sides of the circuit board 204, and that at least portions of the feed lines 216 are formed on or through interior layers of the circuit board 204.

Figure 3:
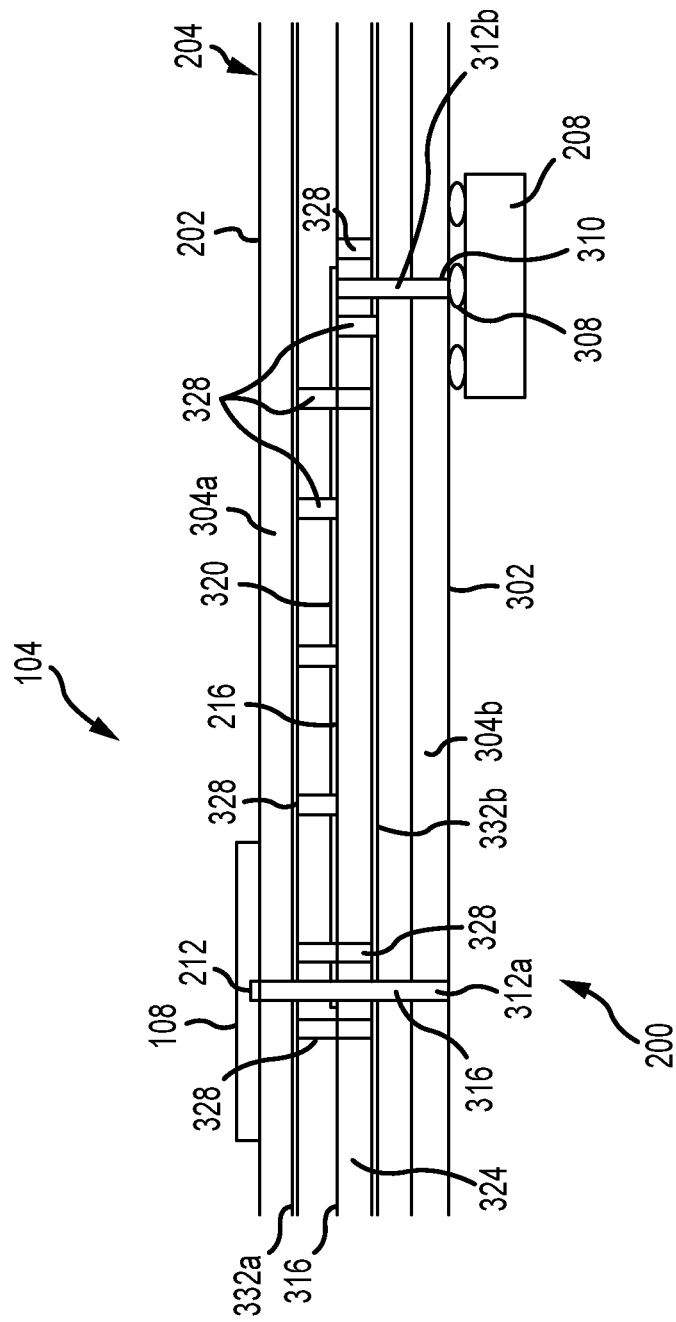
FIG. 3 depicts a portion of an antenna array included in an antenna system in accordance with embodiments of the present disclosure in a cross section view.

FIG. 3 depicts a portion of an example phased array antenna 104 in accordance with embodiments of the present disclosure in a side elevation view. More particularly, a cross-section of a portion of an antenna array 200 showing an antenna element 108, an electronic package 208, and components forming and related to a feed line 216 are illustrated. In general, the antenna element 108 is a planar element placed on an electrically insulating layer or material 304a forming the first surface 202 of the circuit board 204. The electronic package 208 may comprise a flip chip type integrated circuit connected via a plurality of bump or solder ball bonds 308 to one or more electrodes 310 on or at a surface of an electrically insulating layer or material 304b forming the second surface 302 of the circuit board 204. The feed line 216 in this example operatively connects the antenna element 108 to the electronic package 208.

As shown in FIG. 3, the feed line 216 can be formed from or associated with a number of components. In particular, in this example the feed line 216 includes a first conductive via 312a that connects to the feed point 212 of the antenna element 108 at a first end. The conductive via 312a can itself include one or more plated through hole portions 316, and can establish a direct electrical connection with a conductive trace 320 portion of the feed line 216 that extends along or within an interior layer 324 of the circuit board 204. The conductive trace 320 extends along the interior layer 324 to a second conductive via 312b. The second conductive via 312b is directly electrically connected to and extends from the conductive trace 320 to an end forming an electrode 310 that is joined to the solder ball bump 308, to thereby establish electrical contact with an electrode or pin on the electronic package 208.

Figure 4:
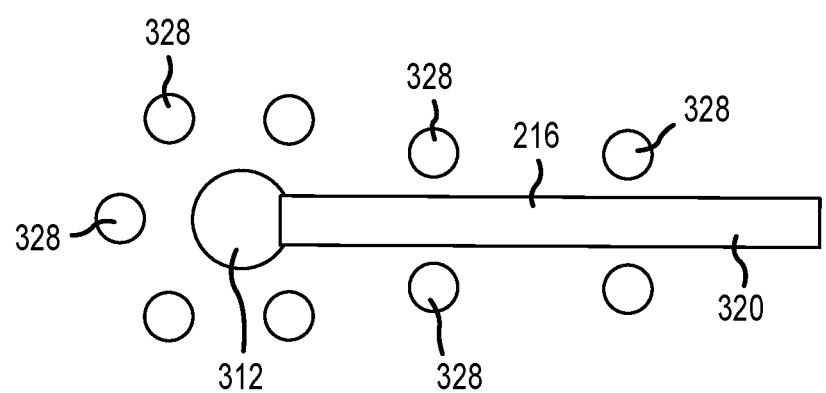
FIG. 4 depicts a portion of a feed network of an antenna system in accordance with embodiments of the present disclosure in a plan view.

In accordance with further embodiments of the present disclosure, the antenna 100 can include features for isolating electromagnetic signals, thereby reducing stray or interfering signals. As depicted in FIGS. 3-4, such features can be formed in or between the interior layers of the circuit board 204. These features include conductive pads 328 formed between ground planes 332a and 332b that isolate traces 320 formed on interior layers of the circuit board 204. In particular, the conductive pads 328, in combination with interior ground planes 332a and 332b and/or ground conductors of a mixed signal layer 316 formed on inner layers of the circuit board 204, create a virtual shield wiring configuration around the signal conductor or feed line 216. FIG. 4 is a plan view of a connection between one end of the conductive trace 320 and a conductive via 312, and shows the surrounding conductive pads 328 spaced at intervals around the via 312 and both sides of the of the conductive trace 320, to isolate the related portion of the feed line 216. More particularly, the placement of the conductive pads 328 in combination with the ground planes 332 prevent the propagation of potentially interfering electromagnetic waves to other areas of the antenna system or the surrounding environment.

As can be appreciated by one of skill in the art after consideration of the present disclosure, the conductive vias 312 are generally formed as plated through holes, which usually must be formed by drilling a hole from one side of a circuit board 204 to a desired interior layer, or all the way through to the opposite side. In contrast, the conductive pads 328 are interlayer conductive elements, and therefore do not require that holes be formed through a substrate or layer of the circuit board. Instead, the conductive pads 328 can be formed by placing a conductive paste or other conductive material within recesses defined by an intermediate layer, such as a prepreg layer applied to a substrate, metallic, or other layer. Accordingly, the conductive pads 328 can be used to form electrical connections between adjacent conductive layers (e.g. ground planes), or adjacent signal traces (e.g. feed lines) or the like, and do not require a drilling operation. Therefore, unlike a conductive via 312, a conductive pad 328 can be placed entirely within interior portions of a circuit board lay up. In addition, conductive pads 328 can be used to connect adjacent layers of the circuit 204 to one another. In addition, a conductive pad 328 can be joined directly to a ground plane, a ground conductor, or a conductive via. A first conductive pad 328 can also be electrically joined to a vertically adjacent second conductive pad 328.

In this example, the feed line 216 is formed on the mixed signal interior layer 316, however other configurations, such as a feed line 216 formed on a dedicated signal layer, are also possible. As shown, the conductive pads 328 can also be arranged vertically to create a virtual shield wiring configuration around a via 312 that extends between two or more layers of the circuit board 204. In addition, the conductive pads 304 can be used to interconnect signal paths. For example, a conductive pad 328 can interconnect a via 312 to a signal line 216, or can connect a first via 312 formed in a first circuit board 204 to a second via 312 formed in a second circuit board that is stacked on the first circuit board 204.

As can be appreciated by one of skill in the art after consideration of the present disclosure, the feed lines 216 may comprise the signal lines that pass communication signals between an integrated circuit 208 and an associated antenna element 108. Moreover, the feed lines 216 can be configured as part of a beam forming combiner or network. Feed lines 216 can also comprise power and digital signal lines. In accordance with embodiments of the present disclosure, the feed lines 216 can be formed on inner layers of the circuit board 204.

Figure 5:
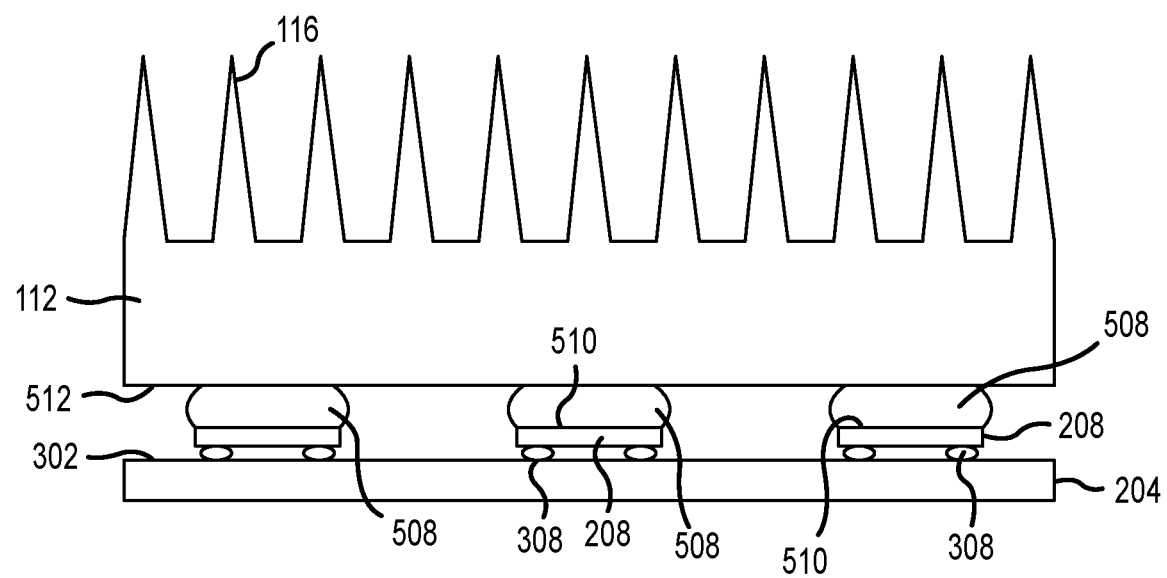
FIG. 5 depicts a heat sink arrangement of an antenna system in accordance with embodiments of the present disclosure in a cross section view.

The antenna system 100 can include features to facilitate the removal of heat from the components of the antenna array 104. As depicted in FIG. 5, the electronic packages 208 can be mounted to the second surface 302 of the circuit board 204, opposite the first surface 202. In accordance with at least some embodiments of the present disclosure, the electronic packages 208 can include pins, pads, wires, or other conductors that are electrically connected to electrode pads or the like formed on the second surface 302 of the circuit board by bumps bonding, solder balls, or other electrical connections or bonding 308. As can be appreciated by one of skill in the art after consideration of the present disclosure, although such bonding techniques can be used to establish reliable electrical connections, they do not typically provide precise mechanical alignment of connected components, and thus the different electronic packages 208 are often at different distances from and at different non-parallel angles to the second surface 302 of the circuit board 204. This in turn makes it difficult to remove heat from the electronic packages 208 using an integral (i.e. one piece) heat sink 112, as gaps will typically be present between the surfaces of the electronic packages 208 and the heat sink 112.

In accordance with at least some embodiments of the present invention, good thermal conductivity between the electronic packages 208 and the integral heat sink 112 is provided through the inclusion of a thermally conductive paste or gel 508. The thermally conductive gel 508 is applied across the second surface 510 of each integrated circuit 208. More particularly, the thermally conductive gel 508 is applied to each electrical component 208 in a layer that is thick enough to extend from the second surface 510 of a respective electrical component to a plane defined by a point on a second surface 510 of an electrical component 208 that is farthest from the plane defined by the second surface 302 of the circuit board 204. Accordingly, differences in the distances between individual electronic packages 208 and the second surface 302 of the circuit board 204, and differences in the alignment of the electronic packages 208 that cause the surfaces of the electronic packages 208 to be at non-parallel angles relative to the second surface 302 of the circuit board and relative to a first surface 512 of the heat sink element 112. An area of the first surface 512 of the heatsink is then positioned over the plurality of electronic packages 208, and placed in contact with the thermally conductive gel 508 on each of the packages 208. Because of the compliance provided by the thermally conductive gel 508, a thermally conductive path is established between the entire second surface 510 of each electronic package 208 and a corresponding portion of the heat sink element 112. Moreover, the first surface 512 of the heat sink element 112 can be oriented such that it is parallel to the second surface 202 of the circuit board 204.

The thermally conductive gel 508 may be formed from a dielectric, thermally conductive material. In accordance with at least some embodiments, the thermally conductive gel 508 never fully hardens, and thus remains pliable and able to remain in contact with both the surfaces 510 of the electronic packages 208 and adjacent areas of the first surface 512 of the heat sink 112, even in the presence of thermal expansion or contraction of the connected components 112 and/or 208.

Figure 6:
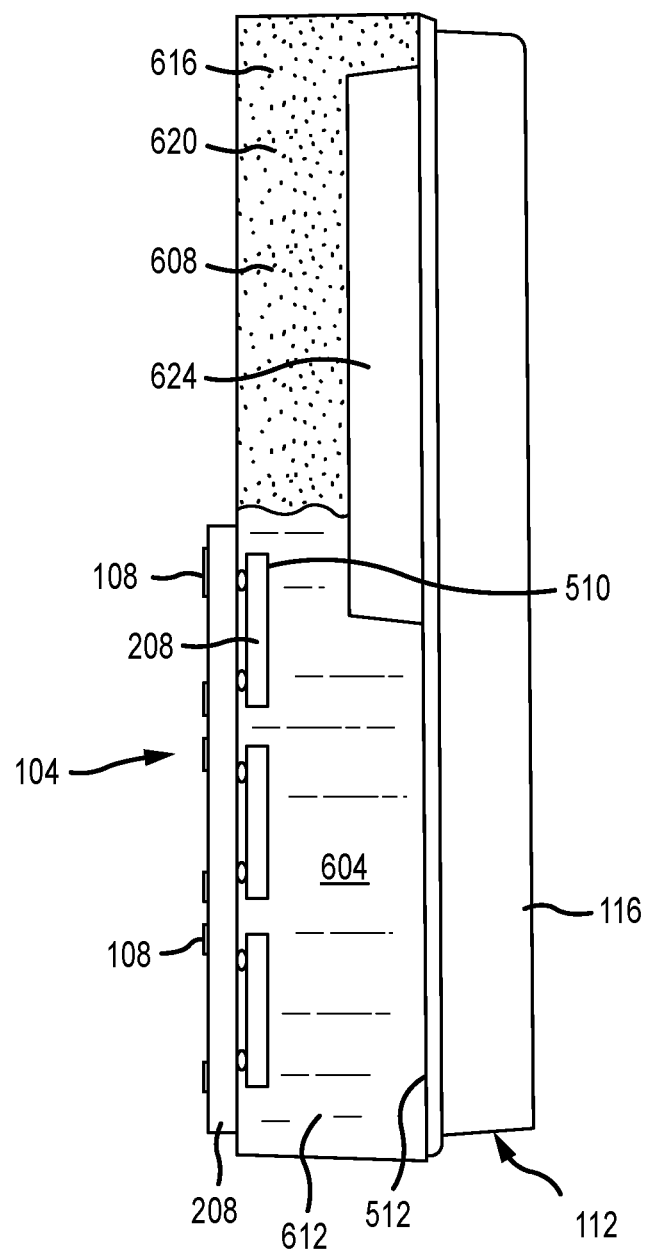
FIG. 6 depicts a heat sink arrangement of an antenna system in accordance with other embodiments of the present disclosure in a cross section view.

With reference now to FIG. 6, another implementation of features for removing heat from the components of the antenna array 104 is depicted. In such embodiments, a heat transfer medium 604 is held within a closed chamber or heat transfer medium volume 608. At least first a portion of the heat transfer medium volume 608 includes or is defined by a first surface 510 of each of the electronic packages 208, and at least a second portion of the heat transfer medium volume 608 is defined by the first surface 512 of the heat sink 112. The heat transfer medium 604 is a material that is in a liquid state 612 within a first temperature range, and that is in a gaseous state 616 at temperatures above the first temperature range. Moreover, the heat transfer medium 604 may comprise a thermally conductive, dielectric material.

In accordance with embodiments of the present disclosure, the heat transfer medium volume 608 is partially filled with the heat transfer medium 604 while the heat transfer medium 604 is in the liquid state 612. More particularly, the heat transfer medium volume 608 may be filled to a level at which the first surfaces 510 of the electronic packages 208 are all in contact with the liquid phase 612 of the heat transfer medium 604. The heat transfer medium volume 608 is sized so that a head space 620 remains above the liquid 612 after the surfaces 510 of the electronic packages 208 have been covered. The head space 620 accommodates heat transfer medium vapor 616 created by boiling the heat transfer medium 604 as a result of a phase change caused by transferring heat from the electronic packages 208 to the heat transfer medium 604. In accordance with at least some embodiments of the present disclosure, the first surface 512 of the heat sink 112 can feature internal fins 624. Alternatively or in addition, the heat sink 112 can include external fins 116. Internal fins 624 increase the area of the heat sink 112 in contact with heat transfer medium 604. For example, as depicted in FIG. 6, internal fins 624 can be provided in all or portions of the head space portion 620 of the heat transfer medium volume 608. As can be appreciated by one of skill in the art after consideration of the present disclosure, the internal heat transfer fins 624 increase the surface area of the heat sink exposed to the heat transfer medium vapor 616 and/or liquid 612, thereby promoting condensation or cooling of the heat transfer medium, and the return of vaporized 616 heat transfer medium 604 to the liquid state 612. External fins 116 increase the surface area of the heat sink 112 in contact with the ambient environment.

As can be appreciated by one of skill in the art after consideration of the present disclosure, an antenna system 100 can therefore include passive cooling features. Moreover, the passive cooling features incorporate various measures to enhance the removal of heat from the electronic packages 208. These measures can include the use of a compliance member to transfer heat from at least the surface 510 of each electronic package 208 and an integral heat sink 112. Moreover, the compliance member can be in the form of a thermally conductive, dielectric gel 508, or in the form of a thermally conductive, dielectric heat transfer medium 604 that is liquid within at least a first temperature range. These configurations thus remove heat through the integrated circuit chip package. Moreover, embodiments of the present disclosure allow sufficient removal of heat to ensure reliable operation of the antenna system 100, without requiring the use of fans or pumps.

As the antenna 100 is a planar antenna, it can be used either as a stand-alone component or combined and synchronized with other arrays to support hybrid beamforming and multiple-input-multiple-output (MIMO) functionality as part of a larger array. According to an exemplary embodiment, the antenna system 100 can have the following attributes: the antenna operates on 28 GHz channels and link parameters requiring higher gain than an omni-directional antenna, and multiple users in a channel requires a spatially agile beam; the beam is capable of covering a 60 degree conical sector relative to the antenna face; the antenna is a time domain duplex (TDD) implementation, and features >−8 dB/K G/T and >48 dBm EIRP at boresight.

Planar phased array technology is enabled by combining the integration of digital control and analog circuits in silicon RFICs with multi-layer circuit board technology. The array is controlled by an embedded CPU, which receives beam steering commands on three interfaces" Ethernet, USB-serial and Low Voltage Differential Signaling (LVDS). The LVDS allows the beam to be steered in less than 20-microseconds. As a specific example, the system 100 can comprise a 5G, rapid prototype phased array antenna 104 designed to cover the 27.5 to 30 GHz frequency band. In addition to application to terrestrial communication networks, embodiments of the present disclosure can also be used in implementing satellite communication systems. The antenna can include a single planar printed circuit board with associated electronics on one side of the circuit board, and radiating elements on the opposite side. A beamforming combiner, power planes, ground planes and control signal routing can be formed on one or more inner layers of the printed circuit board.

In accordance with at least some embodiments of the present disclosure, the technology encompasses:

(1) An antenna system, comprising:
a circuit board;
at least a first electronic package on a first side of the circuit board;
a plurality of first feed lines; and
a plurality of antenna elements on a second side of the circuit board, wherein each antenna element is connected to one of the first electronic package and another electronic package by at least one of the first feed lines.

(2) The antenna system of (1), further comprising:
a plurality of electronic packages; a plurality of sub-groups of antenna elements, wherein each sub-group of antenna elements includes at least two of the antenna elements, and wherein each radiating element included in a sub-group of antenna elements is connected to an associated electronic package by at least one of the first feed lines.

(3) The antenna system of (1) or (2), further comprising:
a plurality of second feed lines, wherein each radiating element included in a sub-group of antenna elements is connected to the associated electronic package by at least one of the second feed lines.

(4) The antenna system of (3), wherein each of the first feeds is perpendicular to each of the second feed lines.

(5) The antenna system of any of (1) to (4), further comprising a beamforming combiner formed on an inner layer of the circuit board.

(6) The antenna system of any of (1) to (5), further comprising a plurality of electrically conductive pads, wherein the electrically conductive pads extend between adjacent ground plane features of the circuit board, and wherein the electrically conductive pads are formed at intervals on first and second sides of a feed line.

(7) The antenna system of any of (2) to (6), further comprising:
a heat sink element, wherein the heat sink element has an area that encompasses an area including the plurality of electronic packages;
a plurality of thermally conductive gel elements, wherein each thermally conductive gel element is in contact with and extends across an entire first surface of each of the electronic packages, and wherein each thermally conductive gel element is in contact with the heat sink element.

(8) The antenna system of (7), wherein a surface of the heat sink element in contact with the thermally conductive gel elements is planar, and wherein an opposite surface of the heat sink element includes fins.

(9) The antenna system of any of (1) to (6), further comprising:
a heat sink element;
a heat transfer medium volume;
a heat transfer medium contained within the heat transfer medium volume, wherein the heat transfer medium is in contact with each of the electronic packages.

(10) The antenna system of (9), wherein the heat transfer medium volume includes a head space portion.

(11) The antenna system of (10), wherein the heat transfer medium is in a vapor phase in the head space portion of the heat transfer medium volume.

(12) The antenna system of any of (9) to (11), wherein the heat transfer medium is in a liquid phase in a portion of the heat transfer medium volume adjacent the electronic packages.

(13) The antenna system of any of (10) to (12), wherein the heat sink element includes a plurality of interior fins in the head space portion of the heat transfer medium volume, and wherein the heat sink element includes a plurality of exterior fins.

In accordance with further aspects of the present disclosure, the technology encompasses:

(14) An antenna system, comprising:
a circuit board;
a plurality of radiating elements on a first surface of the circuit board;
a plurality of electronic packages on a second surface of the circuit board;
a plurality of feed lines, wherein for each electronic package feed lines in the plurality of feed lines connect the electronic package to at least two of the radiating elements.

(15) The antenna system of (14), further comprising:
a heat sink, wherein the heat sink is thermally connected to the electronic packages by a thermally conductive compliance member.

(16) The antenna system of (15), wherein the thermally conductive compliance member is a gel, wherein a layer of the gel connects a surface of each of the electronic packages to a surface of the heat sink.

(17) The antenna system of (15), further comprising a heat transfer medium volume, wherein the thermally conductive compliance member is a thermally conductive medium contained within the heat transfer medium volume.

(18) The antenna system of (15) or (17), wherein the heat sink includes internal fins, wherein a portion of the heat transfer medium in a vicinity of the electronic packages is in a liquid phase, and wherein a portion of the heat transfer medium in a vicinity of the internal fins of the heat sink are in a vapor phase.

(19) The antenna system of any of (15) to (18), wherein the heat sink is an integral element.

In accordance with still further embodiments of the present disclosure, the technology encompasses:

(20) A method for thermal control of a phased array antenna, comprising:
contacting a surface of a plurality of electronic packages on a surface of a circuit board with a heat exchange medium;
removing heat from the plurality of electronic packages to the heat exchange medium, wherein a phase of the heat exchange medium is changed from a liquid phase to a vapor phase;
containing the vapor phase of the heat exchange medium in a head space of a heat exchange volume; and
condensing the vapor phase of the heat exchange medium on internal fins of a heat sink.

In accordance with additional embodiments of the present disclosure, the technology encompasses:

(21) An antenna system, comprising:
a circuit board;
at least a first electronic package on a first side of the circuit board;
a plurality of first feed lines;
a plurality of antenna elements on a second side of the circuit board, wherein each antenna element is connected to one of the first electronic package and another electronic package by at least one of the first feed lines;
a plurality of electronic packages;
a plurality of sub-groups of antenna elements, wherein each sub-group of antenna elements includes at least two of the antenna elements, and wherein each radiating element included in a sub-group of antenna elements is connected to an associated electronic package by at least one of the first feed lines; and
a plurality of electrically conductive pads, wherein the electrically conductive pads extend between adjacent ground plane features of the circuit board, and wherein the electrically conductive pads are formed at intervals on first and second sides of the at least one of the feed lines.

(22) The antenna system of (21), further comprising:
a conductive via, wherein the conductive via is directly electrically connected to an end of the signal line, and wherein at least one of the electrically conductive pads is formed adjacent the end of the at least one of the feed lines.

(23) The antenna system of any of (21) to (22), further comprising:
a heat sink element, wherein the heat sink element has an area that encompasses an area including the plurality of electronic packages;
a plurality of thermally conductive gel elements, wherein each thermally conductive gel element is in contact with and extends across an entire first surface of each of the electronic packages, and wherein each thermally conductive gel element is in contact with the heat sink element.

(24) The antenna system of (23), wherein a surface of the heat sink element in contact with the thermally conductive gel elements is planar, and wherein an opposite surface of the heat sink element includes fins.

(25) The antenna system of any of (21) or (22), further comprising:
a heat sink element;
a heat transfer medium volume;
a heat transfer medium contained within the heat transfer medium volume, wherein the heat transfer medium is in contact with each of the electronic packages.

(26) The antenna system of (25), wherein the heat transfer medium volume includes a head space portion.

(27) The antenna system of (26), wherein the heat transfer medium is in a vapor phase in the head space portion of the heat transfer medium volume.

(28) The antenna system of any of (25) to (27), wherein the heat transfer medium is in a liquid phase in a portion of the heat transfer medium volume adjacent the electronic packages.

(29) The antenna system of any of (26) to (28), wherein the heat sink element includes a plurality of interior fins in the head space portion of the heat transfer medium volume, and wherein the heat sink element includes a plurality of exterior fins.

In accordance with still further embodiments of the present disclosure, the technology encompasses:

(30) An antenna system, comprising:
a circuit board;
a plurality of radiating elements on a first surface of the circuit board;
a plurality of electronic packages on a second surface of the circuit board; and
a heat sink, wherein the heat sink is thermally connected to the electronic packages by a thermally conductive compliance member.

(31) The antenna system of (30), wherein the thermally conductive compliance member is a gel, wherein a layer of the gel connects a surface of each of the electronic packages to a surface of the heat sink.

(32) The antenna system of (30), further comprising a heat transfer medium volume, wherein the thermally conductive compliance member is a thermally conductive medium contained within the heat transfer medium volume.

(33) The antenna system of (32), wherein the heat sink includes internal fins, wherein a portion of the heat transfer medium in a vicinity of the electronic packages is in a liquid phase, and wherein a portion of the heat transfer medium in a vicinity of the internal fins of the heat sink are in a vapor phase.

(34) The antenna system of any of (30) to (33), wherein the heat sink is an integral element.

(35) The antenna system of any of (30) to (34), further comprising:
a plurality of ground plane layers;
a plurality of feed lines, wherein at least a first one of the feed lines is between an adjacent pair of ground plane layers, and wherein for each electronic package feed lines in the plurality of feed lines connect the electronic package to at least two of the radiating elements;
a conductive via, wherein the conductive via is directly electrically connected to a first end of at least a first one of the feed lines; and
a plurality of electrically conductive pads, wherein at least some of the electrically conductive pads extend between the adjacent pair of ground plane layers and are placed at intervals along a length of the first one of the feed lines and adjacent the first end of the first one of the feed lines.

The foregoing description has been presented for purposes of illustration and description. Further, the description is not intended to limit the disclosed systems and methods to the forms disclosed herein. Consequently, variations and modifications commensurate with the above teachings, within the skill or knowledge of the relevant art, are within the scope of the present disclosure. The embodiments described hereinabove are further intended to explain the best mode presently known of practicing the disclosed systems and methods, and to enable others skilled in the art to utilize the disclosed systems and methods in such or in other embodiments and with various modifications required by the particular application or use. It is intended that the appended claims be construed to include alternative embodiments to the extent permitted by the prior art.

What is claimed is:

1. An antenna system comprising:
a circuit board;
a plurality of electronic packages on a first side of the circuit board;
a plurality of first feed lines;
a plurality of antenna elements on a second side of the circuit board, wherein each antenna element is connected to at least one of the electronic packages by at least one of the first feed lines;
a plurality sub-groups of antenna elements, wherein each sub-group of antenna elements includes at least two of the antenna elements, and wherein each antenna element included in a sub-group of antenna elements is connected to an associated electronic package by at least one of the first feed lines;
a heat sink element;
a heat transfer medium volume; and
a heat transfer medium contained within the heat transfer medium volume, wherein the heat transfer medium is in contact with each of the electronic packages, and wherein the heat transfer medium volume includes a head space portion.

2. The antenna system of claim 1, further comprising:
a plurality of second feed lines, wherein each antenna element included in a sub-group of antenna elements is connected to the associated electronic package by at least one of the second feed lines.

3. The antenna system of claim 2, wherein each of the first feed lines is perpendicular to each of the second feed lines.

4. The antenna system of claim 1, further comprising a beamforming combiner formed on an inner layer of the circuit board.

5. The antenna system of claim 4, further comprising a plurality of electrically conductive pads, wherein the electrically conductive pads extend between adjacent ground plane features of the circuit board, and wherein the electrically conductive pads are formed at intervals on first and second sides of at least one of the first and second feed lines.

6. The antenna system of claim 1, wherein a surface of the heat sink element forms a portion of the heat transfer medium volume, wherein at least a portion of the heat sink element surface that forms a portion of the heat transfer medium volume is in contact with a portion of the heat transfer medium is planar, and wherein an opposite surface of the heat sink element includes fins.

7. The antenna system of claim 1, wherein the heat transfer medium is in a vapor phase in the head space portion of the heat transfer medium volume.

8. The antenna system of claim 7, wherein the heat transfer medium is in a liquid phase in a portion of the heat transfer medium volume adjacent the electronic packages.

9. The antenna system of claim 8, wherein the heat sink element includes a plurality of interior fins in the head space portion of the heat transfer medium volume, and wherein the heat sink element includes a plurality of exterior fins.

10. An antenna system, comprising:
a circuit board;
plurality of radiating elements on a first surface of the circuit board;
a plurality of electronic packages on a second surface of the circuit board;

a plurality of feed lines, wherein for each electronic package feed lines in the plurality of feed lines connect the electronic package to at least two of the radiating elements;

a heat sink, wherein the heat sink is thermally connected to the electronic packages by a thermally conductive compliance member; and a heat transfer medium volume, wherein the thermally conductive compliance member is a thermally conductive medium contained within the heat transfer medium volume, wherein the heat sink includes internal fins, wherein a portion of the heat transfer medium in a vicinity of the electronic packages is in a liquid phase, and wherein a portion of the heat transfer medium in a vicinity of the internal fins of the heat sink is in a vapor phase.

11. The antenna system of claim 10, wherein the heat sink is an integral element.

12. A method for thermal control of a phased array antenna, comprising:

contacting a surface of a plurality of electronic packages on a surface of a circuit board with a heat exchange medium;

removing heat from the plurality of electronic packages to the heat exchange medium, wherein a phase of the heat exchange medium is changed from a liquid phase to a vapor phase;

containing the vapor phase of the heat exchange medium in a head space of a heat exchange volume; and condensing the vapor phase of the heat exchange medium on internal fins of a heat sink.

13. The antenna system of claim 1, wherein a surface of the heat sink element forms a portion of the heat transfer medium volume.

14. The antenna system of claim 13, wherein a surface on the first side of the circuit board forms another portion of the heat transfer medium volume.

15. The antenna system of claim 10, wherein the heat sink includes external fins.

* * * * *